(12) United States Patent
Tanaka (10) Patent No.: US 6,358,765 B2
(45) Date of Patent: Mar. 19, 2002

(54) METHOD FOR MANUFACTURING ORGANIC ELECTROLUMINESCENCE DISPLAY DEVICE

(75) Inventor: Taizou Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 6 days.

(21) Appl. No.: 09/750,798

(22) Filed: Dec. 28, 2000

(30) Foreign Application Priority Data

Dec. 28, 1999 (JP) ............................................ 11-374917

(51) Int. Cl.⁷ ............................................... G01L 21/00
(52) U.S. Cl. ........................................... 438/29; 438/59
(58) Field of Search ............................. 438/29, 30, 59, 438/60, 61; 257/59, 72, 350, 66, 60, 291, 382, 420

(56) References Cited

U.S. PATENT DOCUMENTS

| | | | | |
|---|---|---|---|---|
| 6,117,529 A | * | 9/2000 | Leising et al. | 428/209 |
| 6,147,442 A | * | 11/2000 | Codama et al. | 313/292 |
| 6,157,127 A | * | 12/2000 | Hosokawa et al. | 313/506 |
| 6,160,272 A | * | 12/2000 | Arai et al. | 257/72 |
| 6,195,142 B1 | * | 2/2001 | Gyotoku et al. | 349/69 |
| 6,215,250 B1 | * | 4/2001 | Hirano et al. | 315/169.3 |
| 6,252,248 B1 | * | 6/2001 | Sano et al. | 257/59 |

FOREIGN PATENT DOCUMENTS

| | | |
|---|---|---|
| JP | 59194393 | 5/1984 |
| JP | 2311591 | 12/1990 |
| JP | 4129191 | 4/1992 |
| JP | 4133065 | 5/1992 |
| JP | 4175395 | 6/1992 |
| JP | 4264189 | 9/1992 |
| JP | 4304466 | 10/1992 |
| JP | 4308688 | 10/1992 |
| JP | 4364153 | 12/1992 |
| JP | 05-025473 | 2/1993 |
| JP | 5234681 | 9/1993 |
| JP | 05-239455 | 9/1993 |
| JP | 05-310949 | 11/1993 |
| JP | 05-320634 | 12/1993 |
| JP | 06-001972 | 1/1994 |
| JP | 06-025659 | 2/1994 |
| JP | 06-049079 | 2/1994 |
| JP | 07-053953 | 2/1995 |
| JP | 07-138562 | 5/1995 |
| JP | 07-252474 | 10/1995 |
| JP | 09-102395 | 4/1997 |
| JP | 09-245965 | 9/1997 |
| JP | 4129271 | 4/1999 |
| JP | 3269084 | 11/1999 |

* cited by examiner

Primary Examiner—Michael Lebentritt (57) ABSTRACT

In a method for manufacturing an organic EL element, a low-resistance conductive layer is formed on an electrode of an organic EL element formed on a substrate in a state in which the substrate is at a temperature not higher than the freezing point so that no abnormal current nor short circuit occurs on the organic EL element when applying a voltage to it.

10 Claims, 7 Drawing Sheets

METHOD FOR MANUFACTURING ORGANIC ELECTROLUMINESCENCE DISPLAY DEVICE

BACKGROUND OF THE INVENTION

1. Field of the Invention

The present invention relates to a method for manufacturing an organic electroluminescence (EL) display device having organic EL elements, and more particularly to a method for forming a low-resistance conductive layer on one of electrodes of an organic EL element.

2. Description of the Prior Art

An organic electroluminescence (EL) element utilizes a phenomenon in which holes injected from an anode and electrons injected from a cathode are recombined in a light-emission layer having a luminescence capability and light is emitted when they are deactivated from an excited state. These studies are improving the efficiency of light emission by making a light-emission layer be of a multilayer structure and started from paying attention to a high luminescence quantum efficiency and a molecular structure capable of being variously designed of organic compounds, but have only provided too low brightness and efficiency of light emission to put their organic EL elements to practical use.

After that, however, Tang and others found that the performance was remarkably improved by adopting a layered structure combined with a material having an excellent capability for transporting holes (hereinafter referred to as a hole transport layer) instead of a conventional structure having only a light-emission layer interposed between electrodes (Applied Physics Letter, Vol. 51, pp. 913, 1987).

Taking this opportunity, the studies have been concentrated in techniques based on fully separating functions into a layer having a role of injecting holes (a hole injection layer) and a layer having a role of transporting electrons (an electron transport layer) and the like, and the techniques are spurred to be put to practical use as display devices in conjunction with organic materials more improved in performance. In recent years, materials providing emission of the three primary colors, namely, red, green and blue required for a full color display device in high brightness and in high efficiency can be obtained and carrier transport materials suitable for the respective materials are being selected.

A method for driving an organic EL element capable of being used for a unit or pixel of a display device of various kinds of industrial equipment can follow a liquid crystal driving method. That is to say, a passive (matrix) driving method depending on the multiplex performance of elements, an active matrix driving method to arrange and attach a switching element for each pixel, and the like can be mentioned.

However, since an organic EL element has a property which emits light by passing carriers, namely, flowing current inside it, its electric characteristics are particularly more important in comparison with a liquid crystal display device. The reason is described in the following.

Figure 1:
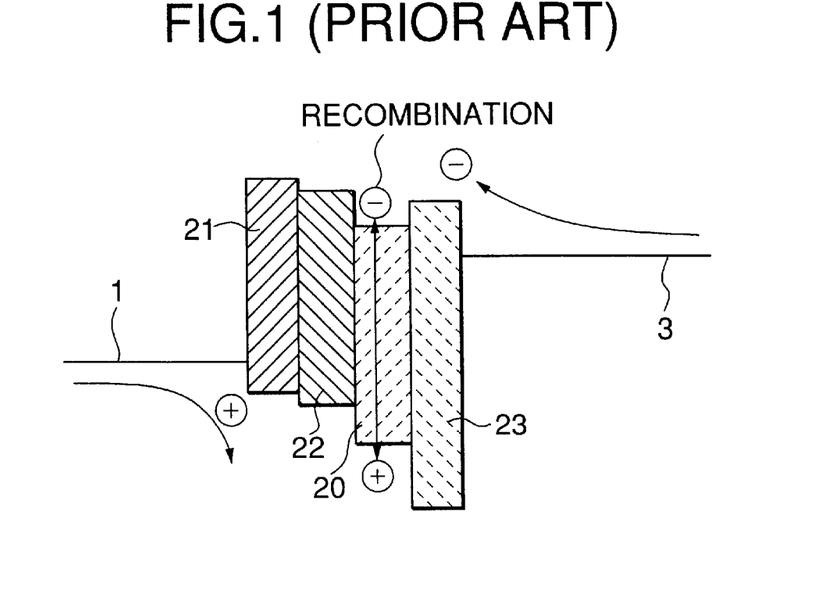
FIG. 1 is a cross-sectional view of a schematic structure for explaining operation of an organic EL element according to a conventional example.

FIG. 1 shows a process of luminescence of a general organic EL element. In FIG. 1, an anode 1, a hole injection layer 22, a hole transport layer 21, a light-emission layer 20 and an electron transport layer 23 are stacked in order, and holes and electrons injected by an intense electric field from the anode and cathode must hop over several organic functional layers having some potentials before they are recombined.

It is desirable that each organic layer has a band structure partitioned by ideal potentials as shown in FIG. 1, but since actually each organic layer includes a film being liable to crystallize or put its structure out of order due to change in temperature, a current leak path is generated and a leak current is taken out to the outside as an abnormal current in the element.

And from the same reason, an abnormal current is generated also when the element is driven by an inverse bias. This means that so long as an electric field is applied to an element, a leak current is generated regardless of whether or not the element emits light, and this becomes a cause to remarkably degrade the quality of the element as a display device.

As a method for suppressing such an abnormal current, Japanese Patent Laid-Open Publication No. Hei 9-102,395 discloses a method of using aluminum as a material for a cathode. However, this method has an insufficient effect on suppression of an abnormal current. And Japanese Patent Laid-Open Publication No. Hei 9-245,965 discloses a technique related to an anode characterized in that its surface roughness is a maximum of 5 nm or less, but this technique reveals a problem of a high cost required for polishing the surface of an anode and a problem of reproducibility.

SUMMARY OF THE INVENTION

As a result of diligent studies in consideration of the above-mentioned problems, an object of the present invention is to find and provide a method for manufacturing an organic EL display device to generate neither abnormal current nor short circuit in an organic EL element of it when a voltage is applied to it.

In order to attain the above object, the present invention provides a method for manufacturing an organic EL display device having an organic EL element having an organic layer which is composed of at least one layer on a substrate and which is interposed between a first electrode provided on said substrate side and a second electrode provided on the other side, said method being characterized by forming a metal layer or a metal oxide layer in a state where the substrate is cooled in an area including at least the second electrode of the organic EL element on the second electrode.

And in the above method for manufacturing an organic EL display device, as the structure of an organic EL element comprising a first electrode, a second electrode and a low-resistance conductive layer of a metal layer or a metal oxide layer, the following structures (1) to (7) obtained by combining the respective layers can be conceived.

The above organic EL element is characterized by one of the following structures:

(1) first electrode/light-emission layer/second electrode/low-resistance conductive layer;

(2) first electrode/hole transport layer/light-emission layer/second electrode/low-resistance conductive layer;

(3) first electrode/hole injection layer/light-emission layer/second electrode/low-resistance conductive layer;

(4) first electrode/hole injection layer/hole transport layer/light-emission layer/second electrode/low-resistance conductive layer;

(5) first electrode/light-emission layer/electron transport layer/second electrode/low-resistance conductive layer;

(6) first electrode/hole injection layer/light-emission layer/electron transport layer/second electrode/low-resistance conductive layer;

(7) first electrode/hole injection layer/hole transport layer/light-emission layer/electron transport layer/second electrode/low-resistance conductive layer.

The first feature of the present invention described above is in that a process of manufacturing an organic EL display device includes a process of forming as a film an organic EL element at a room temperature of 15 to 30° C. or at a temperature of 1 to 14° C. not higher than the room temperature and additionally a process of forming a low-resistance conductive layer on the surface including the second electrode of the organic EL element as keeping the substrate cooled to a low temperature not higher than the freezing point. It is desirable that the substrate is cooled to a temperature of 0 to −60 ° C.

DETAILED DESCRIPTION OF THE PREFERRED EMBODIMENTS

A basic manufacturing process according to the present invention is described with reference to FIG. 2 in the following.

Figure 2A:
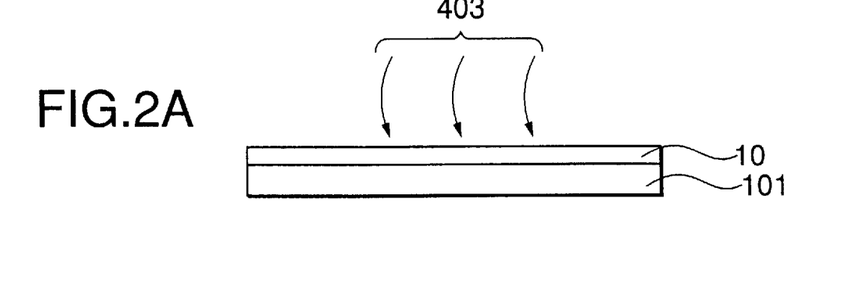
FIG. 2A to FIG. 2E are schematic cross-sectional views for explaining a process of forming an organic EL element according to the present invention.

As shown in FIG. 2A, a transparent electrode film 10 of ITO or the like as an anode is formed on a transparent substrate 101 of a glass plate or the like, and is cleaned by means of an ultraviolet rays and ozone cleaning process or the like.

Next, a substrate having a transparent electrode is prepared by etching the transparent electrode film 10 so as to become a specified pattern.

Figure 2B:
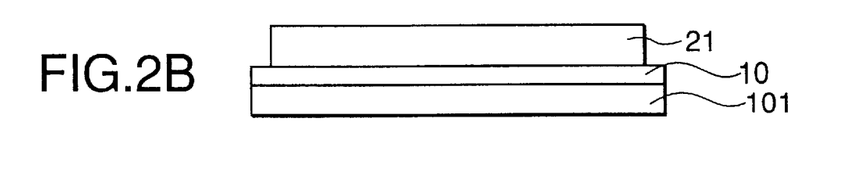

Next, as shown in FIG. 2B, a hole transport layer 21 to be formed out of α-NPD (N,N'-diphenyl-N,N'-bis (1-naphthyl)-(1,1'-biphenyl)-4,4'-diamine) and the like is formed on the transparent electrode film 10 by means of a vacuum evaporation process.

Figure 2C:
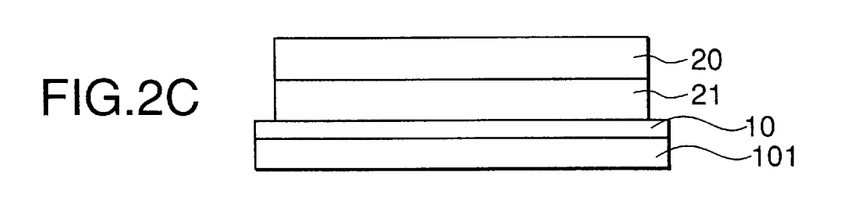

Following this, as shown in FIG. 2C, a light-emission layer 20 to be formed out of Alq3 (tris (8-quinolinoleate) aluminum complex) and the like is formed on the hole transport layer 21. It is desirable that these organic layers 20 and 21 are all formed at a room temperature of about 30° C.

Figure 2D:
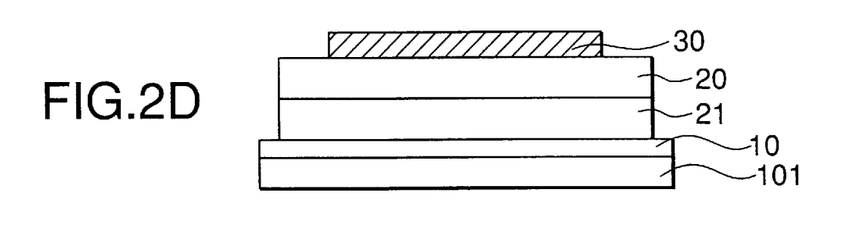

Next, as shown in FIG. 2D, a cathode film 30 of an aluminum-lithium alloy or the like to be the cathode of an organic EL element is formed on the light-emission layer 20 by means of a vacuum evaporation process.

A manufacturing process itself up to here is substantially the same as a conventional organic EL element manufacturing process.

Figure 2E:
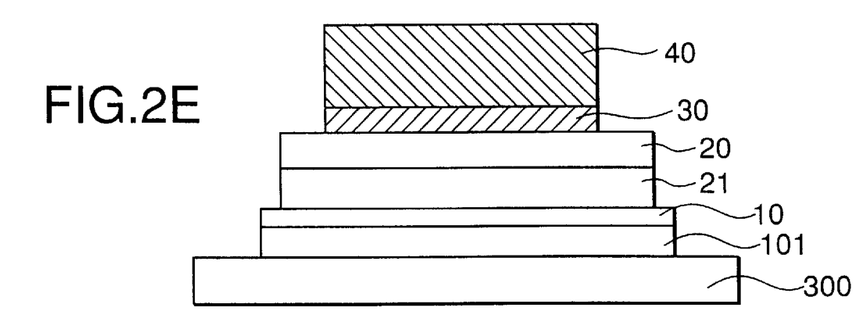

Next, as shown in FIG. 2E, a low-resistance conductive layer 40 of aluminum or the like is formed on the cathode film 30, and the present invention is characterized in that a process of forming it is performed while cooling the substrate.

A method of cooling a substrate on which an organic EL element is formed is described later with reference to FIG. 4, but briefly speaking, a low-resistance conductive layer 40 is evaporated on a cathode layer 30 in a state in which a substrate 101 is cooled by bringing the reverse side of the substrate 101 into contact with a substrate cooling means 300 such as a coolant reservoir or the like in a vacuum chamber.

As capabilities required for the low-resistance conductive layer, there are to further reduce an insufficient resistance of the second electrode 30 and to prevent moisture in the air from entering an organic layer. As materials adapted to these requirements, it is possible to mention aluminum, copper, silver and the like. In this case the same material as a material for the second electrode may be used. However, it is desirable that a substrate is at a room temperature of 15 to 30° C. when a second electrode 30 is formed, and it is desirable that a substrate is in a state in which it is cooled to a temperature not higher than the freezing point when a low-resistance conductive layer 40 is formed. The reason is described in the following.

The work function of the interface between an organic layer and a second electrode 30 (the interface between an electron transport layer 23 and a second electrode layer 30 in this case) determines the height of an electron injection barrier of an organic EL element and governs the performance of the element. In other words, the electron injection barrier results in being liable to change due to variation of the work function of a thin film of the second electrode layer 30. It is known that the work function of a metal material is determined by how the metal is deposited on a substrate (H. Ishida and others, Phis. Rev. B36, 4510 (1987)), and a metal film changes its structure depending on the temperature of its substrate. Therefore, a second electrode 30 of the present invention can provide a conventional work function by forming the second electrode layer in a state in which the substrate is kept at a room temperature.

On the other hand, since a low-resistance conductive layer 40 is not in contact with an electron transport layer 23 and needs to reduce its resistance, namely, increase the thickness of the conductive layer of metal or the like, even if the substrate is cooled the performance of the organic EL element itself is not deteriorated.

Figure 3A:
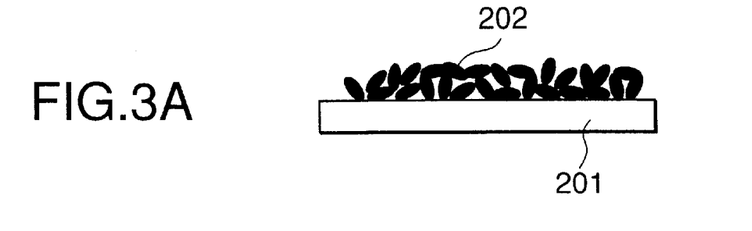
FIGS. 3A and 3B are schematic figures for explaining a state of formation and an effect of action of a low-resistance conductive layer of the present invention.
Figure 3B:
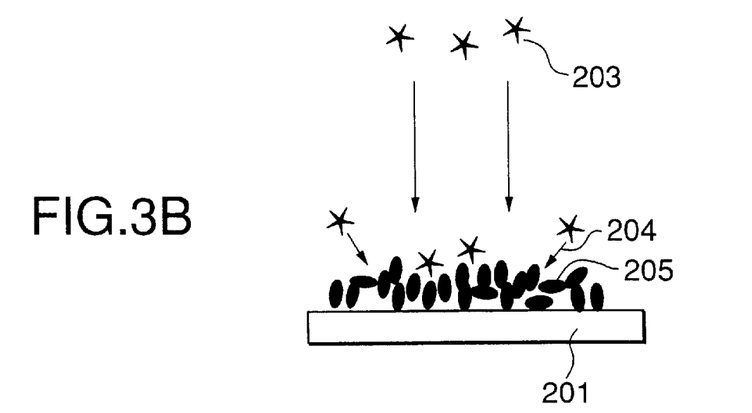

Next, the reason why a substrate is cooled when a metal film is formed as a low-resistance conductive layer 40 in the present invention is described (see FIG. 3).

In case that an organic thin film 202 is formed on a supporting substrate 201 at a room temperature of 30° C. (FIG. 3A), the organic thin film 202 has some ruggedness on the surface of it but does not have such a pin hole that it penetrates the thin film itself formed on it. However, in case that high-energy particles such as conductive particles 203 and the like come flying newly onto this thin film to deposit on the organic thin film 202 (see FIG. 3B), a part of the cohesive energy of metal (ordinarily, heat energy 204) is given to the organic thin film 202 to be the ground. This energy is changed into crystallization 205 of the organic thin film 202 to put the structure of the thin film out of order, and may result in generating a through hole in the organic thin film 202. Hereupon, if the supporting substrate is a conductive substrate (for example, an ITO substrate or the like), a short circuit results in occurring between this substrate and the metal thin film.

Such a phenomenon occurs more remarkably with the increase of the number of metal particles, concretely, the film formation rate or the film thickness.

Thereupon, it is effective to suppress crystallization of the organic thin film 202 and suppress occurrence of pinholes by cooling the substrate when forming the low-resistance metal layer 40 by means of a technique of the present invention. Further, from another reason, in case of forming an organic EL element on a TFT (thin film transistor), if an impurity is mixed into the drain electrode or the source electrode of the thin film transistor, the TFT element may be erroneously operated or short-circuited. In case of forming a metal film, a metal oxide film or the like on a drain electrode or a source electrode, ions inside the metal or metal oxide are thermally diffused due to a temperature rise when the film is formed, and a failure as described above may occur. In order to suppress this, it is effective to cool the substrate. On the other hand, there is a method of cooling a substrate when forming an organic layer (Japanese Patent Laid-Open Publication No. Hei 4-12,919), but this case is not preferable since it brings a bad effect that the carrier mobility of the organic layer is remarkably degraded and the luminescence characteristic of an EL element is deteriorated.

Next, a method of cooling a substrate on which an organic EL element is formed is described with reference to FIG. 4. In a vacuum chamber 301, the organic EL element side is covered with a shadow mask 303 arranged close to a substrate 101 having an organic EL element formed on it, and a low-resistance material is evaporated from an evaporation source 311 of the low-resistance material on the bottom. The substrate 101 is cooled from the reverse side of it by a coolant reservoir 304. In the coolant reservoir 304, a coolant is circulated through a coolant tube as shown by the flow 309 of the coolant from a circulator 308 provided with a temperature controller 307. And as shown by the flow 306 of a gas from a mass flow controller 305, the substrate 101 is cooled by flowing a given gas between the substrate 101 and the coolant reservoir 304.

This substrate cooling method is performed by installing a coolant reservoir 304 for storing a coolant in it inside a vacuum chamber 301 provided with at least one evaporation source 311. The evaporation source 311 may be of a resistance heating type, and may be adapted to various film forming types such as sputtering, ion plating, CVD and the like. This coolant reservoir 304 is connected to a circulator 308 for circulating a coolant and a temperature controller 307 for keeping the coolant at a fixed temperature. A substrate 101 is placed so as to be in contact with this coolant reservoir 304 and the coolant reservoir 304 is cooled by means of the temperature controller 307 until the temperature of the coolant reservoir 304 reaches a specified temperature.

At this time, in case that a substrate 101 is high in thermal conductivity like a Si wafer, it is more effective to the substrate cooling to interpose a sheet being high in thermal conductivity (for example, an indium sheet, a copper sheet, an aluminum sheet or the like) in order to improve the contact between the substrate 101 and the coolant reservoir 304. And in case that a substrate 101 is low in thermal conductivity like a glass substrate, the cooling effect can be improved by making a gap of several microns to several hundred microns between the substrate 101 and the coolant reservoir 304, and flowing a gas (inert gas, nitrogen or the like) between the substrate 101 and the coolant reservoir 304. It is desirable that such a gas is introduced into the vacuum chamber 301 through such a device capable of controlling the flow rate of a gas as a mass flow controller or the like provided outside the chamber 301. It is preferable that for the flow rate of a gas, the pressure inside the vacuum chamber 301 is set at a pressure of $2 \times 10^{-2}$ Pa or less in consideration of the average free path of evaporated particles at the time of forming a film.

According to such a technique, it is enough to heat the evaporation source 311 at a stage in which the substrate 101 has been cooled and evaporate a low-resistance material on the surface electrode of an organic EL element formed on the substrate 101, but when the evaporation source 311 and the substrate 101 are too close to each other, the substrate 101 is liable to rise in temperature due to heat radiation from the evaporation source 311 and therefore it is desirable that they have an interval of at least 100 mm or more between them. And a conveyance mechanism (not illustrated) capable of moving a substrate 101 to another vacuum chamber or the like may be provided.

A process of cooling a substrate 101 can be realized by the method described above, and another cooling method utilizing Peltier effect or the like is also effective.

According to such a manufacturing method, an organic EL element having a layered structure of the first electrode 10 (anode)/hole transport layer 21/light-emission layer 20/second electrode 20 (cathode)/low-resistance conductive layer 40 can be obtained.

As a method of cooling a substrate, a cooling method utilizing Peltier effect or the like is also effective.

Although the thickness of a low-resistance conductive layer 40 is optional, in case that the temperature of a substrate rises by 20° C. or more due to heat radiation from the evaporation source 311, since the surface itself of the substrate rises in temperature higher than that temperature, it is more preferable to once close a shutter for forming a film or turn power off and wait until the substrate temperature comes again to fall in a specified temperature range. The cooling temperature is preferably not higher than the freezing temperature and particularly preferably in a range of 0 to −150° C. When it is not higher than −70° C., migration at the time of forming a low-resistance metal layer 407 is suppressed and its film structure is changed and its metallic gloss may be lost, and therefore the cooling temperature is more preferably in a range of 0 to −60° C.

Figure 5:
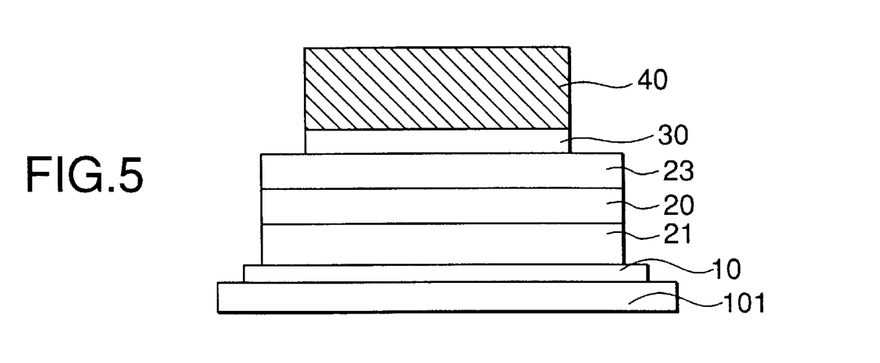
FIG. 5 is a schematic cross-sectional view showing another layered structure of an organic EL element according to the present invention.

Although in an organic EL element described above a cathode 30 has been formed directly on a light-emission layer 20, as shown in FIG. 5 an electron transport layer 23 of tris (8-quinolinoleate) aluminum complex or the like is formed on the light-emission layer 20, and a cathode layer 30 of an aluminum-lithium alloy or the like and a low-resistance conductive layer 40 of aluminum or the like are formed thereon, and thereby an organic EL element having a layered structure of the first electrode 10 (anode)/hole transport layer 21/light-emission layer 20/electron transport layer 23/second electrode (cathode) 30/low-resistance conductive layer 40 can be obtained.

Although the thickness of a low-resistance conductive layer 40 is optional, in case that the temperature of a substrate rises by 20° C. or more due to heat radiation from the evaporation source 311, since the surface itself of the substrate rises in temperature higher than that temperature, it is more preferable to once close a shutter for forming a film or turn power off and wait until the substrate temperature comes again to fall in a specified temperature range.

The cooling temperature is preferably not higher than the freezing temperature and particularly preferably in a range of 0 to −150° C. When it is not higher than −70° C., migration at the time of forming a low-resistance metal layer 407 is suppressed and its film structure is changed and its metallic gloss may be lost, and therefore the cooling temperature is more preferably in a range of 0 to −60° C.

And in the present invention, in case of forming the layered structure of an organic EL element by stacking layers in the inverse order, it is necessary to deposit a metal oxide such as indium-tin oxide (ITO), indium-zinc oxide (IXO) or the like as a transparent conductive layer on an organic layer. In this case, a measure of a mesh electrode or the like is preferably taken for ITO having a great radiation heat, but it is more preferable to use a technique or material for forming a film of a specified resistance value and transmissivity at a room temperature.

As the structure of an organic EL element according to the present invention, layered structures as shown in FIG. 6A to 6F can be conceived in addition to the above-mentioned layered structures.

Figure 6A:
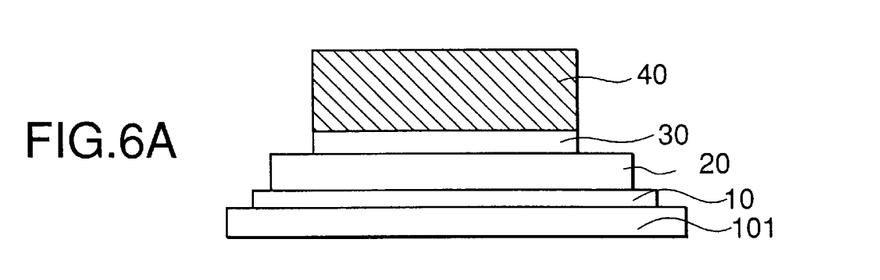
FIG. 6A to FIG. 6F are further other layered structures of organic EL elements according to the present invention.
Figure 6B:
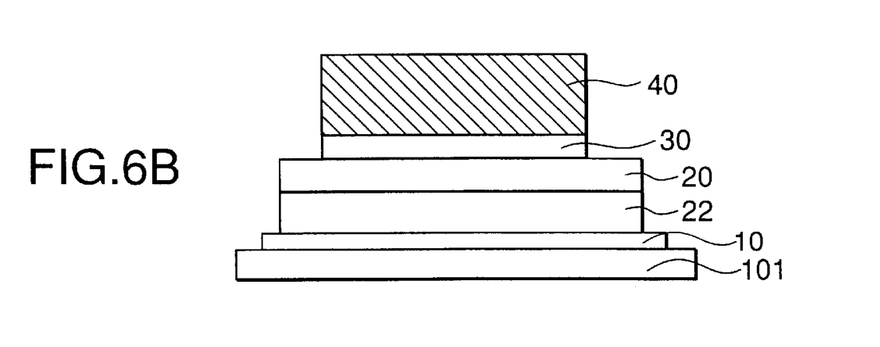
Figure 6C:
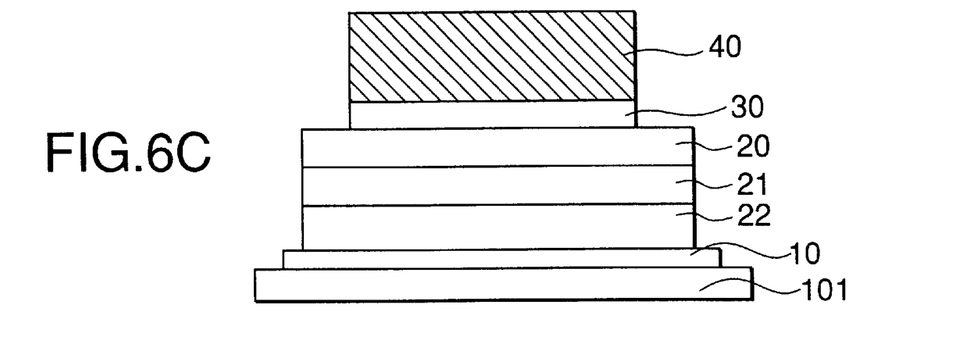
Figure 6D:
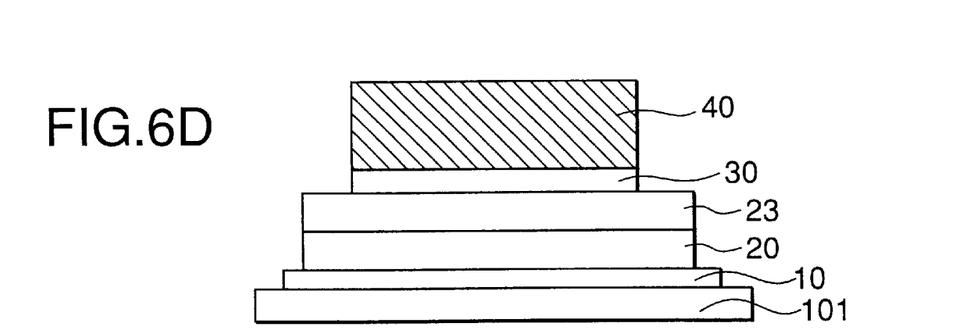
Figure 6E:
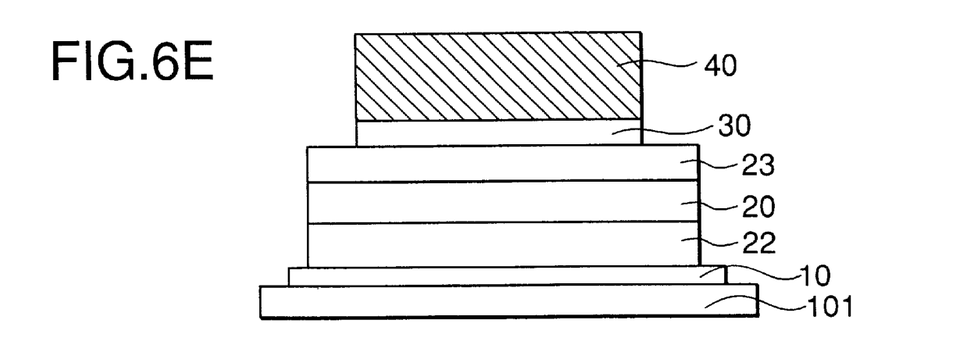
Figure 6F:
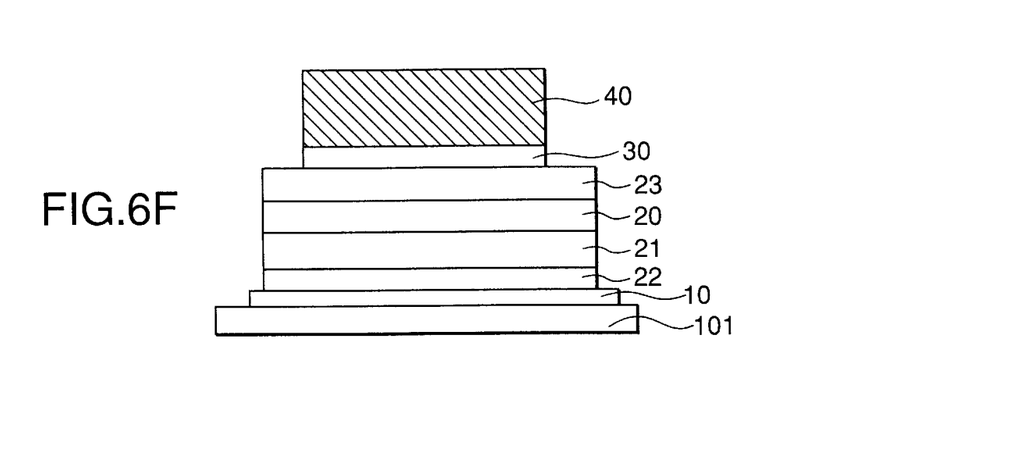

(1) First electrode 10/light-emission layer 20/second electrode 30 (cathode)/low-resistance conductive layer 40 (FIG. 6A);
(2) First electrode 10 (anode)/hole injection layer 22/light-emission layer 20/second electrode 30/low-resistance conductive layer 40;
(3) First electrode 10 (anode)/hole injection layer 22/hole transport layer 21/light-emission layer 20/second electrode 30 (cathode)/low-resistance conductive layer 40;
(4) First electrode 10 (anode)/light-emission layer 20/electron transport layer 23/second electrode 30 (cathode)/low-resistance conductive layer 40;
(5) First electrode 10 (anode)/hole injection layer 22/light-emission layer 20/electron transport layer 23/second electrode 30 (cathode)/low-resistance conductive layer 40;
(6) First electrode 10 (anode)/hole injection layer 22/hole transport layer 21//light-emission layer 20/electron transport layer 23/second electrode 30 (cathode)/low-resistance conductive layer 40.

And in these various layered structures of organic EL elements, each layer may be a mixed layer composed of two or more kinds of materials and another functional layer may be interposed between the respective organic layers. Further, the order of stacked layers may be inverted, and an organic EL element may be composed so as to be controlled by a switching element such as a TFT (thin film transistor) or the like.

Light emission can be obtained from a light-emission layer by applying a voltage to an organic EL element described above. And a full-color organic EL display device can be formed by forming a character and an image through forming pixels and switching elements in the shape of a matrix, and separating organic EL elements into each pixel of, for example, red (R), green (G) and blue (B) and applying an image signal to the respective pixels.

A material for a hole transport layer 21 used in an organic EL element according to the present invention is not limited in particular, and an ordinary compound or new compound to be used as a conventional hole transport material can be also used.

As such a hole transport material, there can be mentioned, for example, an aromatic diamine compound in which 3-class aromatic amine units such as 1,1-bis(4-ditolyl aminophenyl) cyclohexane and the like are linked (Japanese Patent Laid-Open Publication No.Sho 59-194,393); aromatic amine which contains two or more 3-class amines, has nitrogen atoms substituted for two or more fused aromatic rings and is represented by 4,4'-bis(N-(1-naphthyl)-N-phenylamino) biphenyl (Japanese Patent Laid-Open Publication No. Hei 5-234,681); aromatic triamine being a derivative of triphenyl benzene and having a starburst structure (U.S. Pat. No. 4,923,774); aromatic diamine such as N,N'-diphenyl-N or N'-bis(3-methylphenyl) biphenyl-4 or 4'-diamine or the like (U.S. Pat. No. 4,764,625); α, α, α', α', -tetramethyl-α, α'-bis(4-di-p-tolylaminophenyl)-p-xylene (Japanese Patent Laid-Open Publication No. Hei 3-269, 084); triphenylamine derivative being three-dimensionally asymmetric on the whole molecule (Japanese Patent Laid-Open Publication No. Hei 4-129,271); a compound having pyrenyl groups substituted for plural aromatic diamine groups (Japanese Patent Laid-Open Publication No. Hei 4-175,395); aromatic diamine having 3-class aromatic amine units linked by ethylene groups (Japanese Patent Laid-Open Publication No. Hei 4-264,189); a compound having 3-class aromatic amine units linked by thiophene groups (Japanese Patent Laid-Open Publication No. Hei 4-308,688); a benzylphenyl compound (Japanese Patent Laid-Open Publication No. Hei 4-364,153); a compound having 3-class amine units linked by fluorene groups (Japanese Patent Laid-Open Publication No. Hei 5-25,473); a triamine compound (Japanese Patent Laid-Open Publication No. Hei 5-239,455); bisdipyridyl aminobiphenyl (Japanese Patent Laid-Open Publication No. Hei 5-320, 634); N, N, N-triphenylamine derivative (Japanese Patent Laid-Open Publication No. Hei 6-1,972); aromatic diamine having a phenoxadine structure (Japanese Patent Laid-Open Publication No. Hei 7-138,562); diaminophenyl phenantolidine derivative (Japanese Patent Laid-Open Publication No. Hei 7-252,474); a hydrazone compound (Japanese Patent Laid-Open Publication No. Hei 2-311,591); a silazane compound (U.S. Pat. No. 4,950,950); silanamine derivative (Japanese Patent Laid-Open Publication No. Hei 6-49,079); phosphamine derivative (Japanese Patent Laid-Open Publication No. Hei 6-25,659); a quinacridon compound; and the like.

The patent publications and the like contained in parentheses () following the names of materials for a hole transport layer are the patent publication numbers introducing these material names. This is also the same as the following.

And these compounds may be used independently and may be used being mixed with one another according to need.

Further, additionally to the above-mentioned materials, as materials for a hole transport layer, there can be mentioned polyvinyl carbazole or polysilane (Appl. Phys. Lett., Vol.59, pp.2760, 1991); polyphosphozene (Japanese Patent Laid-Open Publication No. Hei 5-310,949); polyamide (Japanese Patent Laid-Open Publication No. Hei 5-310,949); polyvinyl triphenyl amine (Japanese Patent Laid-Open Publication No. Hei 7-53,953); polymer having a triphenyl amine skeleton (Japanese Patent Laid-Open Publication No. Hei 4-133, 065); polymer having triphenyl amine units linked by methylene groups and the like; and polymer such as polymethacrylate and the like containing aromatic amine.

As materials for a hole injection layer, copper phthalocyanine and the like can be mentioned.

And as materials for a light-emission layer 20, there can be mentioned anthracene, pyrene, Tris(8-quinolinoleate) aluminum complex and its derivative known as luminescent materials from the past, and in addition to them, bis-stylylanthracene derivative, tetraphenyl butadiene derivative, coumarin derivative, oxadiazole derivative, distylyl benzene derivative, pyrrolopyridine derivative, perinone derivative, cyclopentadiene derivative, oxazole derivative, thiadiazolopyridine derivative, perinon derivative, and polymer such as polyphenylene vinylene derivative, polyparaphenylene derivative, polythiophene derivative and the like.

And for the purpose of improving the efficiency of light emission or making longer the life of light emission, a light-emission layer may have a very small amount of impurity intentionally mixed in it, and concretely the impurity is selected from rublene, quinacridon derivative, phenoxazone 660, dicyanomethylene stylyl pyrane, perinon, perirene, coumarin derivative, dimethyl aminopyradine carbonitrile, pyradine dicarbonitrile derivative, Nile Red, rhodamine derivative and the like.

The performance required for material used for an electron transport layer 23 is to efficiently transport electrons injected from a cathode. For this purpose, the material should be high in electron mobility and electron affinity, and excellent in film forming ability.

As materials to meet such a condition, there can be mentioned oxine complex such as tris(8-quinolinoleate) aluminum complex and the like, periren derivative, perinon derivative, naphthalene derivative, coumarin derivative, oxadiazole derivative, phenanthroline derivative and the like.

Formation of a thin film of these organic materials described above is performed mainly by a vacuum evaporation method, but can be also performed by an electron beam evaporation method, a sputtering method, a molecule stacking method and a coating method using a solvent. In case of such a coating method, an organic material can be coated by being dissolved or dispersed in a solvent together with polyvinyl chloride, polycarbonate, polystyrene, poly (N-vinyl carbazole), polymethyl methacrylate, polybutyl methacrylate, open-ring polymer of norbornene derivative, polyester, polysulfone, polyphenylene oxide, polybutadiene, hydrocarbon resin, ketone resin, phenoxy resin, polyamide, ethyl cellulose, ABS resin, phenol resin, silicone resin, epoxy resin and the like.

And in the present invention, as shown in FIG. 5, a first electrode 10 needs to be transparent in case of taking out light from the supporting substrate 101 side. It is formed out of a conductive metal oxide such as tin oxide, indium oxide, indium-tin oxide (ITO), indium-zinc oxide (IXO) or the like. Or such metal as gold, silver, chromium, aluminum or the like may be stacked and formed as a bus electrode on a part of ITO into a layered structure; or a conductive inorganic material such as copper iodide, copper sulfide or the like, or polythiophene, polypyrrole, polyaniline, polyphenylene vinylene, polyphenylene or polyethylene, or these conductive polymer processed by doping may be used as a bus electrode and formed with ITO into a layered structure. Preferably, ITO glass, Nesa glass or IXO glass is used.

Since the resistance of an anode is enough if it can supply a sufficient current for light emission of an element, it is not limited in particular, but from the viewpoint of power consumption of the element it is desirable that the anode has a low resistance.

Next, since a second electrode 30 must make an electron transport layer efficiently transfer electrons to a light-emission layer, the adhesion of the electrode to a material adjacent to it, the adjustment of ionizing potential and the like are needed. And in order to keep a stable performance for a long-term use, it is desirable to use a comparatively stable material in the air, but since a protective film or a proper sealing means can be used, it is not limited to these. Concretely, it is possible to use metal such as indium, gold, silver, aluminum, lead, magnesium or the like, or a simple substance of rare-earth element, alkali metal, or an alloy of these, and the like. And even metal compounds of fluoride or oxide of alkali metal can be used in case that their work function is suitable for injection.

EMBODIMENTS

First embodiment

An embodiment according to the present invention is described with reference to FIG. 5 in the following. In this embodiment, an ITO film as a transparent electrode 10 was formed so as to be 100 nm in thickness on a transparent glass substrate 101 by a sputtering method. Its sheet resistance at this time was $10\Omega/\square$. Next, the ITO film was etched so as to form a specified pattern and thereby a glass substrate with an ITO pattern was prepared. This substrate was cleaned with pure water and IPA, and then was cleaned by means of an ultraviolet (UV) and ozone cleaning process to sufficiently clean the surface of it.

Next, A-NPD (N,N'-diphenyl-N,N'-bis (1-naphthyl)-(1,1'-biphenyl)-4,4'-diamine) of 100 mg in a boat of molybdenum as a material for a hole transport layer, and Alq3 (tris(8-quinolinoleate) aluminum complex) of 100 mg in a boat of molybdenum as a luminescent material were separately prepared and were set inside a vacuum evaporation apparatus so that they are different evaporation sources. The substrate 101 which was previously prepared and had a transparent electrode formed on it was set inside the same vacuum evaporation apparatus, and then the inside of the apparatus was exhausted to a vacuum degree of $2 \times 10^{-4}$ Pa, and at the point of time when the vacuum degree was reached the boat containing α-NPD started to be heated.

The temperature was controlled until the evaporation rate of the α-NPD reached a constant rate of 0.3 nm/sec, and then a shutter provided above the boat was opened to start forming a film, and at the point of time when a film of 50 nm in thickness was formed, the shutter was closed and the evaporation was ended.

In the same manner, a film of Alq3 was formed at a film formation rate of 0.3 nm/sec to be 55 nm in thickness, and formation of the organic layer was ended. The organic layer formation at this time was always performed at a room temperature of about 30° C. Next, the substrate having this organic layer formed on the surface of it was set again so that the reverse surface of it came into contact with a coolant reservoir in the vacuum chamber, the boats just now used for forming the organic film were removed, instead of them an aluminum-lithium alloy of 1 g was put in a tungsten boat and aluminum of 2 g was put in another tungsten boat, and the inside of the vacuum chamber was exhausted again. At the point of time when the chamber was exhausted to $4 \times 10^{-4}$ Pa, the boat containing the aluminum-lithium alloy was heated under a condition in which the substrate temperature is a room temperature, and the boat temperature was controlled so that an evaporation rate of 0.4 nm/sec could be obtained. When a stable state was obtained, a shutter provided above was opened and when an aluminum-lithium alloy film was formed to be 60 nm in thickness, the film formation was ended, and thereby an organic EL element having a structure of ITO/α-NPD/Alq3/AlLi was obtained.

Next, in order to form a low-resistance metal film, inside the vacuum chamber 301, the temperature of the coolant reservoir was set to the conditions shown in Table 1 corresponding to No. 3 to 10), and when a specified temperature was obtained, a nitrogen gas was flowed from between the substrate and the coolant reservoir. The flow rate of the nitrogen gas at this time was 0.5 SCCM. When the temperature of the substrate came into a sufficiently stable state, the boat containing aluminum was heated and its temperature was controlled so that an evaporation rate of 0.7 nm/sec was obtained. When the evaporation rate became stable, a shutter provided above was opened and when an aluminum film was formed to be 500 nm in thickness, the film formation was finished.

TABLE 1

| No |  | Substrate temperature | Occurrence of short circuit | Rectification ratio | Specific resistance |
|---|---|---|---|---|---|
| 1 | Comparative example 1 | 60 | Yes | 1.1E3 | 2.9 |
| 2 | Comparative | 30 | Yes | 2.5E9 | 3.2 |
| 3 |  | 0 | No | 1.1E7 | 2.0 |
| 4 |  | −10 | No | 2.3E7 | 1.9 |
| 5 |  | −20 | No | 3.6E7 | 2.2 |
| 6 | Embodiment | −30 | No | 6.1E7 | 3.0 |
| 7 | 1 | −40 | No | 3.4E7 | 2.2 |
| 8 |  | −50 | No | 2.3E7 | 1.9 |
| 9 |  | −70 | No | 1.6E7 | 0.9 |
| 10 |  | −150 | No | 1.0E7 | 0.7 |

This element was taken out from the vacuum chamber 301 and the transparent electrode 10 of ITO was connected to the positive pole of a power source and the low-resistance conductive layer 40 of aluminum was connected to the negative pole of the power source. An applied voltage was made to vary from 0 V to 20 V to check existence of a short circuit, but no short circuit was found and emission of green light was obtained. Next, taking the ITO as an anode and the aluminum as a cathode, a leak current of the organic EL element was measured by means of a semiconductor parameter analyzer. As a result, the rectification ratio when applying a voltage of ±15 V was $1 \times 10^7$ or more and no leak current occurred.

Further, a result of measuring the specific resistance of the aluminum being the low-resistance electrode showed a low-resistance value. The result is shown in Table 1 (corresponding to No. 3 to 10), the result of measurement of an element whose film was formed at a temperature of −40° C. is shown in FIG. 7.

Figure 7:
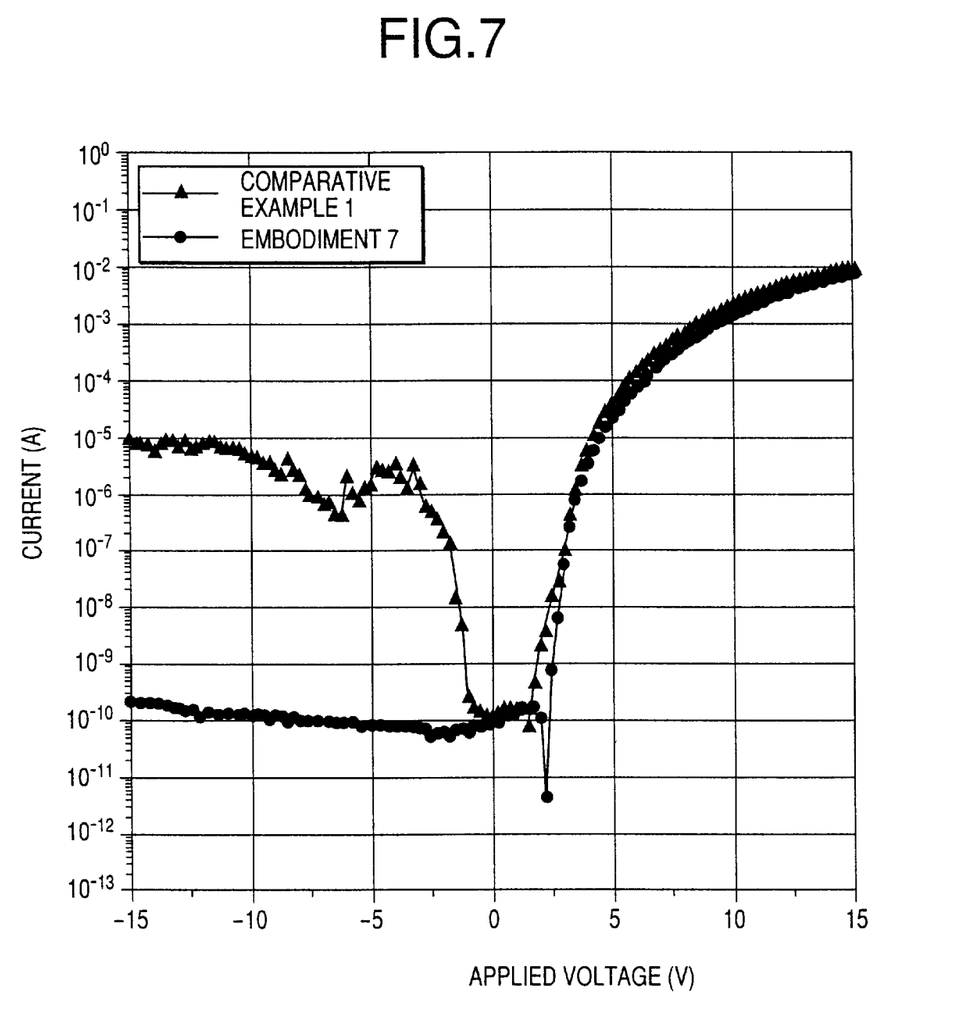
FIG. 7 is a characteristic diagram for comparing in leak current an embodiment of the present invention and a comparative example with each other.

From FIG. 7, it is seen that the characteristic of currents to applied voltages is shown for an embodiment and a comparative example, even when an inverse bias voltage is applied the current value is stable and no leak current occurs. And as a result of observing the light-emission part of each of these elements, conspicuous dark spots were not found at all.

(Description of a manufacturing process)

A manufacturing process according to an embodiment of the present invention is described referring again to FIG. 2. FIG. 2A shows a process of forming a thin ITO film to 100 nm in thickness on a glass substrate 101 and cleaning it.

As performances required for a transparent electrode ITO 10 to be used in an organic EL element, there are a transmissivity of 80% or more and a sheet resistance of 50Ω☐ or less. Such requirements are adopted for the purpose of making the efficiency of taking out light as high as possible and reducing the resistance of wiring. In this case, an ITO film of 100 nm in thickness meets these requirements. And a UV-ozone cleaning process is performed for the purpose of removing organic foreign matters remaining on an ITO substrate.

Next, FIG. 2B and FIG. 2C respectively show processes of forming a hole transport layer 21 and a light-emission layer 20 on the substrate prepared in the process of FIG. 2A. The evaporation rate is the thickness of a film deposited on a substrate per unit time, and an organic matter (a hole transport layer 21 or a light-emission layer 20 in this case) is ordinarily formed into a film at an evaporation rate of 0.3 to 5 nm/sec. The reason is that a too fast evaporation rate raises the temperature of an evaporation source and leads to decomposition of a material. And as the thickness of an organic film a thickness of several nm to several hundred nm has been used from the past. The reason is that a too thin organic film thickness is liable to generate pinholes, while a too thick film thickness causes movement of carriers injected into the material to be delayed by impurities or raises the driving voltage.

Next, a process shown in FIG. 2D shows a second electrode forming process for forming the cathode 30 of an organic EL element. The evaporation rate of a cathode 30 can be selected from a range of about 0.3 to 5 nm/sec from the same reason as when forming an organic film. And its film thickness needs to be thick enough to sufficiently meet the flowing current, but if it is too thick, a short circuit as described above may occur and therefore a thickness of about 40 to 100 nm is preferable.

A process up to here is the same as a conventional organic EL element manufacturing process.

Next, a process shown in FIG. 2E is a process having a feature of the present invention for forming a low-resistance metal layer as cooling a substrate. A method of cooling the substrate is as shown in FIG. 4. Although the thickness of a low-resistance metal layer is optional, in case that the temperature of a substrate rises by 20° C. or more due to heat radiation from the evaporation source 311, since the surface itself of the substrate rises in temperature higher than that temperature, it is more preferable to once close a shutter for forming a film or turn power off and wait until the substrate temperature comes again to fall in a specified temperature range. The cooling temperature is preferably not higher than the freezing temperature and particularly preferably in a range of 0 to −150° C. When it is not higher than −70° C., migration at the time of forming a low-resistance metal layer 407 is suppressed and its film structure is changed and its metallic gloss may be lost, and therefore the cooling temperature is more preferably in a range of 0 to −60° C.

Second Embodiment (Organic EL element of an inverse layered type)

A second embodiment of the present invention is described in detail with reference to FIG. 5. An aluminum-lithium alloy was formed on a transparent glass substrate 101 into a film of 100 nm as a first electrode 10 by means of a sputtering process. Next, the aluminum-lithium alloy was etched so as to form a specified pattern to prepare a glass substrate with an aluminum-lithium thin film. This substrate was cleaned by a UV-ozone cleaning process so that the surface of it was cleaned sufficiently.

Next, as a material for a hole transport layer, Alq3 (tris(8-quinolinoleate) aluminum complex) of 100 mg in a boat of molybdenum as a luminescent material, and α-NPD (N, N'-diphenyl-N,N'-bis(1-naphthyl)-(1,1'-biphenyl)-4,4'-diamine) of 100 mg in a boat of molybdenum and additionally copper phthalocyanine (CuPc) of 100 mg in a boat of molybdenum were set inside a vacuum evaporation apparatus so that they are, respectively, different evaporation sources. The substrate 101 which was previously prepared was set inside the same vacuum evaporation apparatus, and then the inside of the apparatus was exhausted to a vacuum degree of $2 \times 10^{-4}$ Pa, and at the point of time when the vacuum degree was reached the boat containing Alq3 started to be heated.

The temperature was controlled until the evaporation rate of Alq3 reached a constant rate of 0.3 nm/sec, and then a shutter provided above was opened to start forming a film, and at the point of time when a film of 50 nm in thickness was formed, the shutter was closed and the evaporation was ended. In the same manner, a film of α-NPD was formed at an evaporation rate of 0.3 nm/sec to a thickness of 50 nm, and further in the same manner, a film of CuPc was formed at an evaporation rate of 0.3 nm/sec to a thickness of 30 nm, and the organic layer forming process was ended. The organic layer formation at this time was always performed at a room temperature. Next, the substrate having this organic layer formed on it was set again so as to come into contact with a coolant reservoir of a magnetron sputtering apparatus, and a backing plate having the IXO set on it was set at a specified position and the apparatus was exhausted. At the point of time when the chamber was exhausted to $4 \times 10^{-4}$ Pa, an oxygen gas was introduced into the sputtering apparatus so that the partial pressure of oxygen becomes 0.02 Pa, and a sputtering process was started by turning on a power of 0.90 W/cm².

The temperature of the substrate at this time was a room temperature of about 30° C. When the film thickness became 40 nm, the film formation was ended, and thereby an organic EL element having an inverse layered structure of AlLi/Alq3/α-NPD/CuPc/IXO was obtained.

Figure 4:
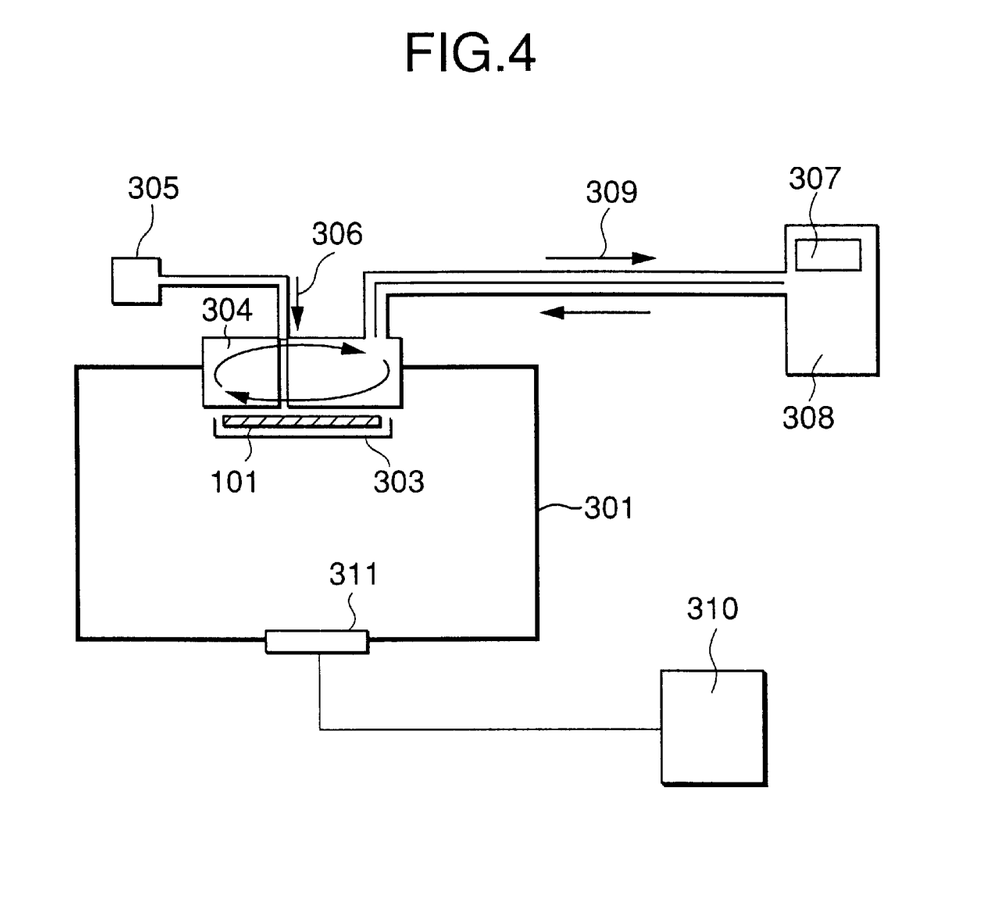
FIG. 4 is a schematic diagram of the structure of an apparatus for forming a low-resistance conductive layer, said apparatus being used in the present invention.

Next, the above-mentioned organic EL element was loaded inside the vacuum chamber 301 shown in FIG. 4, and in order to form a low-resistance conductive film on the IXO film, the temperature of the coolant reservoir was set to −40° C., and when its temperature became a specified temperature, a nitrogen gas was flowed from between the substrate and the coolant reservoir. The flow rate of nitrogen at this time was 0.5 SCCM. When the temperature of the substrate came into a sufficiently stable state, an oxygen gas was introduced so that the partial pressure of oxygen became 0.01 Pa, sputtering IXO was started according to the same technique as described above. When the evaporation rate became stable, a shutter provided above was opened and when an IXO film was formed to be 500 nm in thickness, the film formation was finished.

This element was taken out from the vacuum chamber 301 and the IXO film being a low-resistance conductive layer 40 was connected to the positive pole of a power source and the aluminum-lithium alloy layer 10 was connected to the negative pole of the power source. An applied voltage was made to vary from 0 V to 20 V to check existence of a short circuit, but no short circuit was found and emission of green light was obtained. Next, taking the IXO as an anode and the aluminum-lithium alloy layer as a cathode, a leak current of the organic EL element was measured by means of a semiconductor parameter analyzer. As a result, the rectification ratio when applying a voltage of ±15 V was $4 \times 10^6$ or more and no leak current occurred. And as a result of observing occurrence of dark spots by means of an optical microscope, conspicuous dark spots were not found at all.

Comparative Example 1
(Forming a low-resistance metal layer at a room temperature)

Next, a comparative example to said embodiment 1 is described. A low-resistance metal layer was formed in the vacuum chamber 301 described in FIG. 4, and an organic EL element was formed in the same manner as embodiment 1 except that the low-resistance metal layer 40 was formed at a room temperature of 30° C. without using a coolant at that time.

The ITO of this element was connected to the positive pole of a power source and the aluminum was connected to the negative pole of the power source. An applied voltage was made to vary from 0 V to 20 V to check existence of a short circuit, and an element having a portion short-circuited and being unable to emit light was found. Next, taking the ITO of an element being not short-circuited as an anode and the aluminum as a cathode, a leak current of the organic EL element was measured by means of a semiconductor parameter analyzer. As a result, the rectification ratio when applying a voltage of ±15 V was $2.5 \times 10^3$ and leak current occurred (FIG. 7). The result was shown in Table 1 (corresponding to No. 2 comparative example 3 in Table 1). And as a result of observing the light-emission part of each of these elements by means of an optical microscope, conspicuous dark spots were not found at all.

Comparative Example 2
(With no low-resistance metal layer)

Next, a comparative example 2 is described. An organic EL element was formed in the same manner as embodiment 1 except that no low-resistance metal layer was formed.

Taking the ITO of this element as an anode and the aluminum as a cathode, a leak current of the organic EL element was measured by means of a semiconductor parameter analyzer. As a result, the rectification ratio when applying a voltage of ±15 V was $1 \times 10^7$ or more and no leak current occurred.

However, as a result of observing the light-emission part of each of these elements by means of an optical microscope, the density of conspicuous dark spots was 17 spots/mm², and their light-emission surfaces were found to be uneven. And the specific resistance of an aluminum film measured was found to be $5.5 \times 10^{-9}$ S m, and it was higher by about 1 figure than embodiment 1.

Comparative Example 3
(Forming a low-resistance metal layer at 60° C.)

Next, comparative example 3 is described. An organic EL element was formed in the same manner as embodiment 1 except that a low-resistance metal layer was formed at a substrate temperature of 60° C.

The ITO of this element was connected to the positive pole of a power source and the aluminum was connected to the negative pole of the power source. An applied voltage was made to vary from 0 V to 20 V to check existence of a short circuit, but an element having a portion short-circuited and being unable to emit light was found. Next, taking the ITO of an element being not short-circuited as an anode and the aluminum as a cathode, a leak current of the organic EL element was measured by means of a semiconductor parameter analyzer. As a result, the rectification ratio when applying a voltage of ±15 V was $1.1 \times 10^3$ and a leak current occurred. The result was shown in Table 1 (corresponding to No. 1 comparative example 1 in Table 1). And as a result of observing the light-emission part of each of these elements by means of an Soptical microscope, conspicuous dark spots were not found at all.

Third Embodiment
(Making an organic EL element on a TFT substrate)

Figure 8:
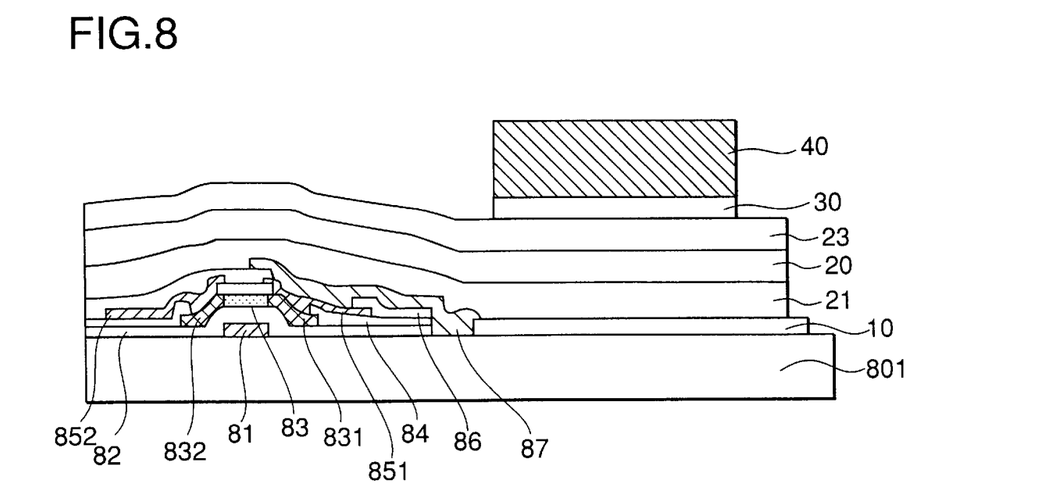
FIG. 8 is a schematic cross-sectional view of the structure of an example in which an organic EL element of the present invention is formed on a TFT substrate.

Next, a third embodiment of the present invention is described with reference to FIG. 8.

An aluminum (Al) film of 150 nm in thickness was formed by a resistance heating evaporation process on a cleaned non-alkali glass (No. 1737 manufactured by Corning, Inc.) substrate 801, and then a gold (Au) film of 10 nm in thickness was deposited on the resulting substrate by means of the same technique.

This was patterned by photolithography and wet-etching for a gate electrode. On the gate electrode 81, a gate insulating film 82 of silicon nitride was formed to become 200 nm in thickness by means of a plasma CVD method. Further, a p-Si film 83 was formed on it to be 60 nm in thickness, and then a $SiO_2$ film was patterned into a specified shape. Using this $SiO_2$ film as a mask, phosphorus was ion-implanted to form a source domain 831 and a drain domain 832.

And a $SiO_2$ film was deposited again, and then SiN was evaporated to form an interlayer insulating film 84.

Next, the interlayer insulating film was etched so that the upper portions of the source and drain domains were opened, and aluminum was evaporated on the whole surface including the opening, and then the aluminum except the aluminum part being on the opening and near the wiring part was etched away and the source electrode and the drain electrode were pattern-formed. Next, the whole surface was coated with a polyimide film by a spin coating method, and thereafter the upper parts of the source electrode and the drain electrode were opened.

Following this, after aluminum was evaporated all over the surface, a source electrode wiring portion 851 and a drain electrode wiring portion 852 were patterned and were coated with a polyimide film 86, and an opening to expose the source electrode wiring portion was provided. Further, openings were provided in the areas where no TFT element was deposited, and an ITO film 10 was formed to be 150 nm in thickness on these areas by means of a sputtering method.

Furthermore, the source electrode of the TFT element and this ITO film were connected by a metal film of as aluminum or the like by means of an evaporation method and an etching method. An organic EL element was deposited on the TFT substrate made in such a way at a substrate temperature being a room temperature in the same manner as the embodiment of a layered structure shown in FIG. 5, and an aluminum film of 500 nm in thickness was formed thereon at a substrate temperature of −40° C. as a low-resistance metal layer 40. When driving this organic EL element with TFT, it was found that no short circuit occurred and no TFT erroneously operated.

Comparative Example 4

(In case of forming a low-resistance metal layer at a room temperature when making an organic EL element on a TFT substrate)

Next, comparative example 4 is described. An organic EL element with TFT was formed in the same manner as the third embodiment except that a low-resistance metal layer was formed at a room temperature when forming the low-resistance metal layer after forming an organic EL element. When driving this organic EL element with TFT, it was found that a short circuit occurred and a TFT erroneously operated.

As described above, the first advantage of the present invention is in that it is possible to suppress a short circuit and a leak current in an organic EL element and reduce the resistance of an area including the wiring portion. As described above, FIG. 7 is a graph showing the first advantage of the present invention. It is understood that like the embodiment of FIG. 7 a leak current is suppressed even in case of applying an inverse bias voltage, by using a manufacturing method of the present invention.

And as the second advantage of the present invention, it is possible to suppress a leak current and simultaneously suppress occurrence of dark spots. The reason is that a low-resistance conductive layer has an advantage of preventing moisture from entering an organic EL element (sealing effect), and that there is not heating of an organic EL element to be a cause of occurrence of dark spots (cause of a structural change of an organic film).

And as the third advantage of the present invention, in case of forming an organic EL element utilizing TFT or the like on the same substrate, it is possible to reduce abnormal operations of TFT due to diffusion of alkali metal being a material for the organic EL element. Alkali metal or the like has a great thermal diffusivity, and particularly is knocked on by heat during formation of a film. The present invention can remove these disadvantages by suppressing such diffusion.

What is claimed is:

1. A method for manufacturing an organic EL element comprising;
   a process of forming a first electrode on a substrate,
   a process of forming a light-emission layer on said first electrode,
   a process of forming a second electrode on said light-emission layer,
   a process of forming a conductive layer on said second electrode in a state in which said substrate is cooled to a lower temperature than the temperature when forming said second electrode.

2. A method for manufacturing an organic EL element according to claim 1, wherein;
   said substrate temperature at the time of cooling said substrate is set in a range of 0 to −60° C.

3. A method for manufacturing an organic EL element according to claim 1, wherein;
   said temperature when forming said second electrode is a room temperature of 15 to 30° C., and during formation of said conductive layer a material for said conductive layer is vacuum-evaporated on said second electrode as cooling said substrate to a temperature not higher than the freezing point by jetting a coolant gas onto said substrate side.

4. A method for manufacturing an organic EL element according to claim 1, wherein;
   a process of forming a hole transport layer between said first electrode and said light-emission layer is provided.

5. A method for manufacturing an organic EL element according to claim 1, wherein;
   a process of forming a hole injection layer between said first electrode and said light-emission layer is provided.

6. A method for manufacturing an organic EL element according to claim 5, wherein;
   a process of forming a hole transport layer between said hole injection layer and said light-emission layer is provided.

7. A method for manufacturing an organic EL element according to claim 1, wherein;
   a process of forming an electron transport layer between said light-emission layer and said second electrode is provided.

8. A method for manufacturing an organic EL element according to claim 7, wherein;
   a process of forming a hole injection layer between said light-emission layer and said first electrode is provided.

9. A method for manufacturing an organic EL element according to claim 8, wherein;
   a process of forming a hole transport layer between said light-emission layer and said hole injection layer is provided.

10. A method for manufacturing an organic EL element according to claim 1, wherein;

a process of forming a thin film transistor on said substrate before forming said first electrode and a process of connecting an electrode of said thin film transistor and said first electrode to each other are provided.

* * * * *